(12) United States Patent
Chiu et al.

(10) Patent No.: US 6,992,601 B2
(45) Date of Patent: Jan. 31, 2006

(54) INPUT APPARATUS USING MULTIDIMENSIONAL ELECTRODES TO DEFINE KEY FUNCTIONS AND THE ENCODING METHOD THEREOF

(75) Inventors: Yen-Chang Chiu, Taipei (TW); Chin-Nan Wu, Tainan (TW)

(73) Assignee: Elan Microelectronics Corporation, (TW)

(*) Notice: Subject to any disclaimer, the term of this patent is extended or adjusted under 35 U.S.C. 154(b) by 757 days.

(21) Appl. No.: 09/969,349

(22) Filed: Oct. 2, 2001

(65) Prior Publication Data

US 2002/0041270 A1 Apr. 11, 2002

(51) Int. Cl.
*H03K 17/94* (2006.01)
*H03M 11/00* (2006.01)

(52) U.S. Cl. ......................................... 341/22; 200/177
(58) Field of Classification Search .................. 341/22, 341/26; 345/168; 400/479, 477; 200/600, 200/175, 177
See application file for complete search history.

(56) References Cited

U.S. PATENT DOCUMENTS

| | | | | | |
|---|---|---|---|---|---|
| 4,609,792 | A | * | 9/1986 | Levasseur | 200/5 A |
| 4,987,275 | A | * | 1/1991 | Miller et al. | 200/5 A |
| 5,220,323 | A | * | 6/1993 | Ito et al. | 341/24 |
| 5,861,823 | A | * | 1/1999 | Strauch et al. | 341/22 |
| 6,157,323 | A | * | 12/2000 | Tso et al. | 341/22 |
| 6,630,927 | B2 | * | 10/2003 | Sherman et al. | 345/168 |

* cited by examiner

*Primary Examiner*—Timothy Edwards, Jr.
(74) *Attorney, Agent, or Firm*—Peter F. Corless; Steven M. Jensen; Edwards & Angell, LLP

(57) ABSTRACT

An input apparatus using multidimensional electrodes to define key functions and the encoding method thereof is peculiarized by utilizing N-dimensional electrodes to define the individual key functions, where N is a positive integer number greater than two. The keyboard scan process according to the present invention is to perform the scan on the coordinate electrodes one by one and save the scan codes for making a synthetic determination, so as to identify the key being pressed. The keyboard encoder IC using the keyboard scan process of the present invention is advantageous to the pin number reduction and cost descent.

14 Claims, 8 Drawing Sheets

|     | X0            | X1       | X2      | X3       | X4      | X5       | X6        | X7            |
|-----|---------------|----------|---------|----------|---------|----------|-----------|---------------|
| Y0  | PAUSE         | POWER    |         | SLEEP    | CTRL-R  | WAKE UP  | CTRL-L    | F5            |
| Y1  | Q             | TAR      | A       | ESC      | Z       | N-CHG    | '(~)      | 1(!)          |
| Y2  | W             | CAP      | S       | K45      | X       | CHG      | F1        | 2(@)          |
| Y3  | E             | F3       | D       | F4       | C       | ROMA     | F2        | 3(#)          |
| Y4  | R             | T        | F       | G        | V       | B        | 5(%)      | 4($)          |
| Y5  | U             | Y        | J       | H        | M       | N        | 6(^)      | 7(&)          |
| Y6  | I             | ]({)     | K       | F6       | ,(<)    | K56      | +'(=)     | 8(*)          |
| Y7  | O             | F7       | L       |          | .(>)    | APP      | F8        | 9('(')        |
| Y8  | P             | [({)     | ;(:)    | '(")     | F42     | /(?)     | _(-)      | 0(')')        |
| Y9  | SCROLL        |          |         | ALT-L    |         | ALT-R    |           | PRINT         |
| Y10 | K14           | BACK     | \(|)    | F11      | ENTER   | F12      | F9        | F10           |
| Y11 | 7 (K)         | 4 (K)    | 1 (K)   | SPACE    | NUM     |          | DEL       | POWER         |
| Y12 | 8 (K)         | 5 (K)    | 2 (K)   | 0 (K)    | / (K)   |          | INS       | SLEEP         |
| Y13 | 9 (K)         | 6 (K)    | 3 (K)   | . (K)    | * (K)   | - (K)    | PAGE UP   | PAGE DOWN     |
| Y14 | + (K)         | K107     | ENTER (K)|         |         |          | HOME      | END           |
| Y15 | WAKE UP       | SHIFT-L  | SHIFT-R |          |         |          |           |               |
| Y16 |               | WIN-L    |         |          |         |          |           |               |
| Y17 | K150 (KC-L)   |          | WIN-R   |          |         |          |           | K151 (KC-R)   |

Fig. 1(c)(PRIOR ART)

|  | X0 | X1 | X2 | X3 | X4 | X5 | X6 | X7 |
|---|---|---|---|---|---|---|---|---|
| Y0 | Q | TAB | A | ESC | Z | N-CHG | '(~) | 1(!) |
| Y0 Y0 | W | CAP | S | K45 | X | CHG | F1 | 2(@) |
| Z1 Y0 | E | F3 | D | F4 | C | ROMA | F2 | 3(#) |
| Z2 Y0 | R | T | F | G | V | B | 5(%) | 4($) |
| Z3 Y1 | U | Y | J | H | M | N | 6(^) | 7(&) |
| Z0 Y1 | I | ]({) | K | F6 | ,(<) | K56 | -'(=) | 8(*) |
| Z1 Y1 | O | F7 | L |  | .(>) | APP | F8 | 9('(') |
| Z2 Y1 | P | [({) | ;(:) | ,(") | K42 | /(?) | _(-) | 0(')') |
| Z3 Y2 | (7) | (4) | (1) | SPACE | NUM |  | DEL |  |
| Z0 Y2 | (8) | (5) | (2) | (0) | (/) |  | INS |  |
| Z1 Y2 | (9) | (6) | (3) | (.) | (*) | (-) | PG_UP | PG_DN |
| Z2 Y2 | (+) | K107 | (ENTER) |  |  |  | HOME | END |
| Z3 Y3 | SCROLL |  |  | ALT-L |  | ALT-R |  | PRINT |
| Z0 Y3 | K14 | BACK | \(|) | F11 | ENTER | F12 | F9 | F10 |
| Z1 Y3 |  | WIN-L |  |  |  |  |  |  |
| Z2 Y3 | PAUSE | POWER | WIN-R | SLEEP | CK-L | WAKE UP | KC-R | F5 |
| Z3 Y4 |  | SHIFT-L | SHIFT-R |  | CTRL-R |  | CTRL-L |  |

Fig. 2(c)

INPUT APPARATUS USING MULTIDIMENSIONAL ELECTRODES TO DEFINE KEY FUNCTIONS AND THE ENCODING METHOD THEREOF

FIELD OF THE INVENTION

The present invention is in connection with an input apparatus, and more particularly the present invention is in connection with an input apparatus using multidimensional electrodes to define key functions and the encoding method thereof.

BACKGROUND OF THE INVENTION

The encoding method for contemporary input apparatus, for example, the keyboard for personal computer (PC), are using the two-dimensional keyboard scan process to define the function of individual keys. As an example of a keyboard encoder IC, commonly it is available as a 40-pin DIP package. The pin assignment of the 40-pin packaged keyboard encoder IC chip is arranged in such a manner that, 24 pins are assigned to define the key functions of a prevalent keyboard for PC with 16×8 keys, 2 oscillating pins, 3 LEDs and clock & data lines. As a result, 33 pins are necessary to complete the keyboard scan process.

The conventional key structure of a keyboard is illustrated in FIG. 1(a). When key 11 is pressed, the first electrode 12 will come into electrical engagement with the second electrode 13. The electrical engagement between the first electrode 12 and the second electrode 13 can be best understood in reference to FIG. 1(b). In FIG. 1(b), the X-axis electrode 121 on the lower thin film and the Y-axis electrode 131 on the upper thin film are interlaced to form a two-dimensional matrix, in which each of the coordinate address (X-coordinate, Y-coordinate) represents a key function, as shown in the look-up table of FIG. 1(c). As the key is pressed to enable the X-axis electrodes and the Y-axis electrodes to come into an electrical engagement, the keyboard will detect the coordinate address (X-coordinate, Y-coordinate) of the intersection of the X-axis coordinate and the Y-axis coordinate, and further the key for which is pressed can be known.

The keyboard scan process for identifying which key is pressed is illustrated in FIG. 1(d). The keyboard encoder will output a low-level signal through the outputs of each of the Y-axis electrodes, and detect whether or not any of the inputs of the X-axis that is originally pulled to a high level is changed. Accordingly, when a key is pressed, a certain input of the X-axis electrode will transit from high level to low level, whereby identifying the key being pressed.

In addition to the identification of the key being pressed, the disposition of the phantom key is another important task. In order to avoid the occurrence of the phantom key, the art of properly arranging the composite keys, such as Ctrl key or Shift key that are likely to be pressed is an effective way to address these problems.

However, how to lower the cost without affecting the performance of the keyboard is a knot that all the keyboard manufacturers are seeking ways to break through. It would be highly desirable to provide an input apparatus that makes use of a different encoding method to perform keyboard scan process, and thus a keyboard encoder IC with less pins, reduced manufacturing cost and enhanced reliability can be obtained.

SUMMARY OF THE INVENTION

It is, therefore, an object of the present invention to provide a encoding method using multidimensional electrodes for defining the key functions of an input apparatus, which is capable of saving the pin number and reducing the cost of the keyboard encoder IC.

It is another object of the present invention to provide an input apparatus using multidimensional electrodes to define the key functions of the input apparatus.

To the end of achieving the objects of the present invention, a keyboard scan process is provided to utilize multidimensional electrodes to define the key functions. Taking an example of three-dimensional electrodes including first-dimensional electrodes, second-dimensional electrodes and third-dimensional electrodes, the method may comprise the steps of:

(a) inputting a signal to a first electrode of the second-dimensional electrodes and saving the outputs of all the electrodes of the first-dimensional electrodes and the third-dimensional electrodes, (b) inputting a signal to a first electrode of the third-dimensional electrodes and saving the outputs of all the electrodes of the first-dimensional electrodes and the second-dimensional electrodes, (c) repeating step (b) to sequentially input signals to other electrodes of the third-dimensional electrodes and saving the outputs of all the electrodes of the first-dimensional electrodes and the second-dimensional electrodes, (d) repeating step (a) to sequentially input signals to other electrodes of the second-dimensional electrodes and saving the outputs of all the electrodes of the first-dimensional electrodes and the third-dimensional electrodes, and (e) identifying the key being pressed by making a synthetic determination according to the outputs previously saved.

Now the foregoing and other features and advantages of the present invention will be more clearly understood through the following descriptions with reference to the accompanying drawings, in which:

BRIEF DESCRIPTION OF THE DRAWINGS

FIG. 1(c) is a look-up table defining the key functions of the keyboard according to the prior art

FIG. 2(c) shows a look-up defining the key functions of the keyboard according to a first preferred embodiment of the present invention;

DETAILED DESCRIPTION OF THE PREFERRED EMBODIMENTS

The present invention is particularized by that each key functions of the input apparatus is defined by multidimensional coordinate system formed of multidimensional electrodes. When a key is pressed, the electrodes corresponding to the key are electrically engaged, so that the coordinate address with respect to the key function can be detected and the key can be identified.

An exemplary embodiment of the present invention now will be fully described with reference to the following preferred embodiments. It is to be emphasized that the following descriptions of embodiments and examples of the present invention is only illustrative, and it is not intended to be exhaustive or not to be limited to the precise form disclosed.

Figure 1A:
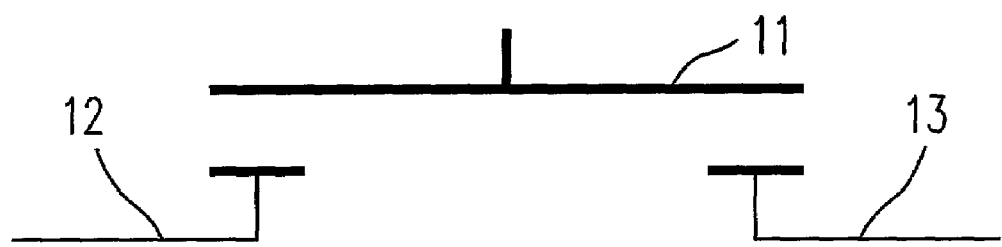
FIG. 1(a) depicts the conventional key structure of a keyboard.
Figure 1B:
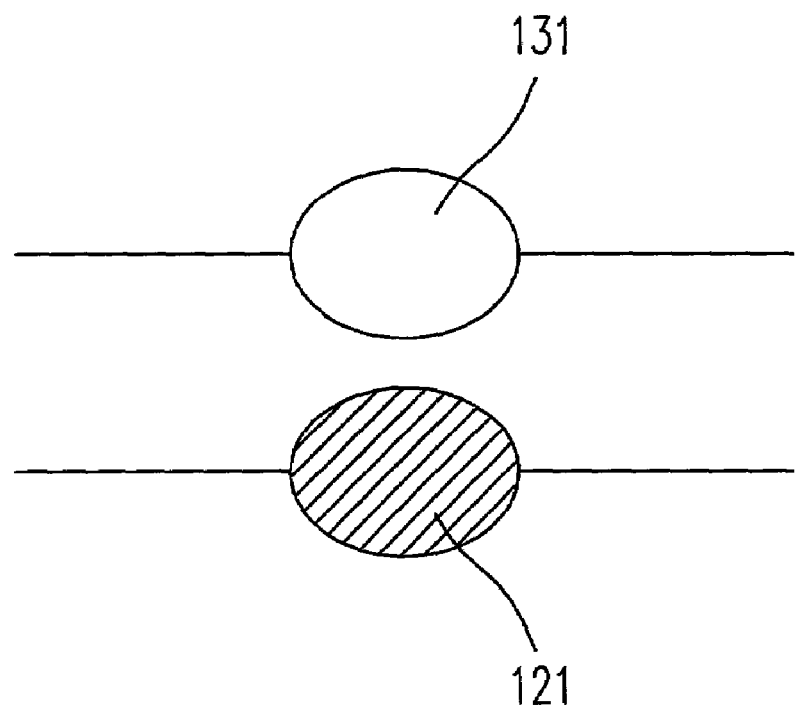
FIG. 1(b) illustrates the electrical engagement between the electrodes in conventional keyboard.
Figure 1D:
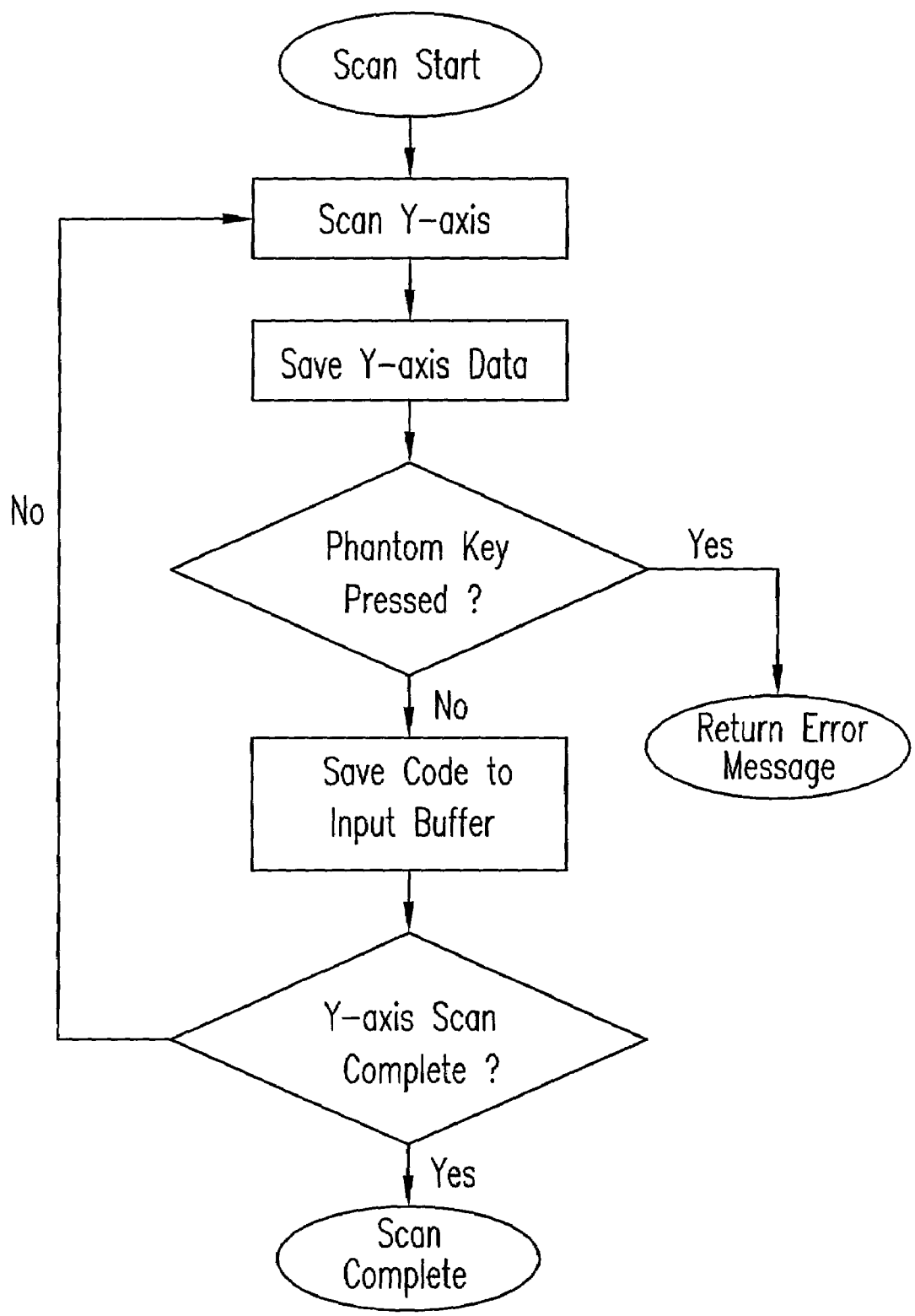
FIG. 1(d) shows the control flow of the two-dimensional keyboard scan process according to the prior art.
Figure 2A:
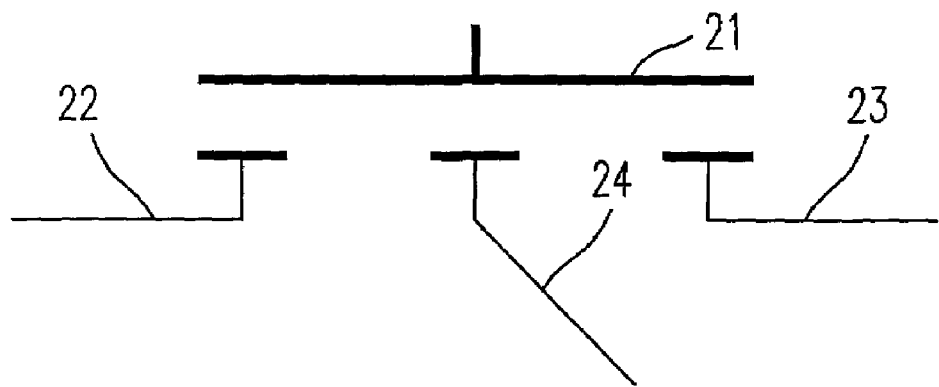
FIG. 2(a) shows a three-dimensional key structure of the keyboard according to a first preferred embodiment of the present invention.
Figure 2B:
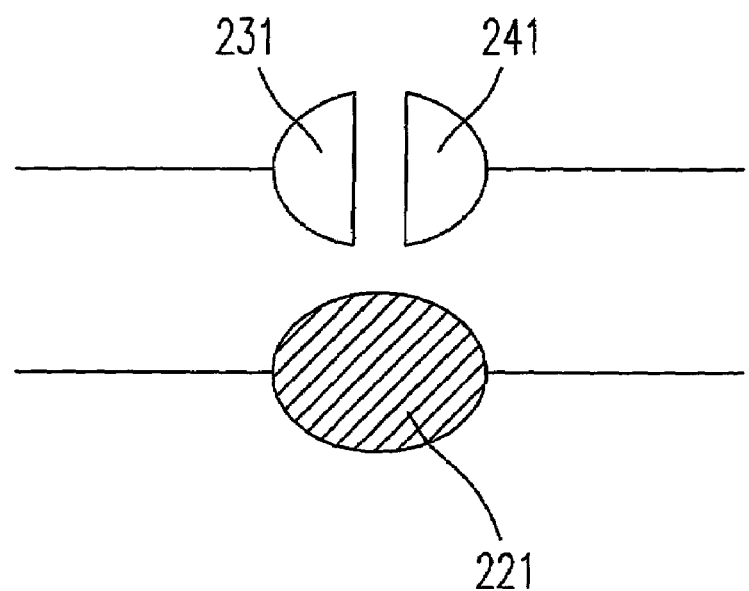
FIG. 2(b) illustrates the electrical engagement between the three-dimensional electrodes in the keyboard according to a first preferred embodiment of the present invention.

FIG. 2(a) shows an outlined view of a first preferred embodiment of a three-dimensional key structure in a keyboard according to the present invention. When key 21 is pressed, the first electrode 21, the second electrode 22 and the third electrode 23 will come into an electrical engagement. The configuration of the electrodes can be implemented as shown in FIG. 2(b). In FIG. 2(b), the X-axis electrode (first dimension) 221 on the lower thin film, the Y-axis electrode (second dimension) 231 and the Z-axis electrode (third dimension) 241 on the upper thin film are interlaced to form a three-dimensional matrix, and each of the coordinate address (X-coordinate, Y-coordinate, Z-coordinate) represents a key function. FIG. 2(c) shows a look-up table of the key functions as defined by a three-dimensional matrix. The key being pressed can be identified by searching the key function corresponding to the coordinate address from the look-up table of FIG. 2(c).

With the intention of preventing the occurrence of the phantom key arising from the composite key (which indicates the key that has to be cooperated with the other keys for use, such as Ctrl key or Shift key), the composite key definitions that are commonly used can be independently integrated into an coordinate axis, such as shown in the last low of the look-up table of FIG. 2(c). In this manner, the arrangement of the phantom key of the present invention unquestionably can make great advance during the keyboard layout process.

Figure 2D:
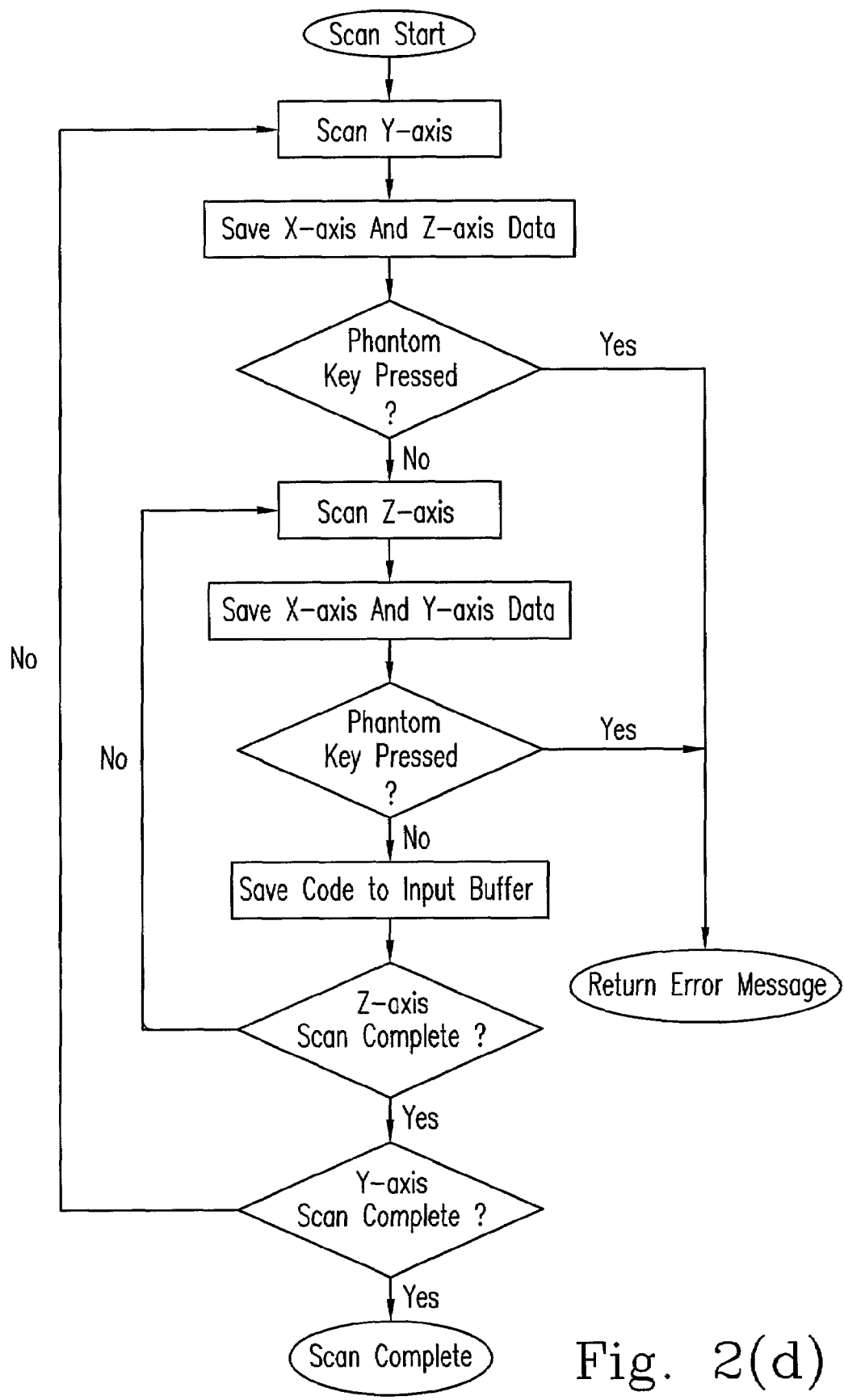
FIG. 2(d) shows the control flow of the three-dimensional keyboard scan process according to a first preferred embodiment of the present invention.

The control flow of the keyboard scan process according to a first preferred embodiment of the present invention will be illustrated in more detail by way of the flowchart of FIG. 2(d). Referring to FIG. 2(d), the keyboard scan process according to a first preferred embodiment of the present invention starts by entering the loop for performing the scan on the Y-axis electrode (second dimension). When the keyboard encoder IC sequentially outputs low-level signals through the outputs of each of the Y-axis electrodes, the inputs of the X-axis electrodes and the Z-axis electrodes which are originally pulled to a high level will be checked whether or not the inputs of these coordinate electrodes transit from high level to low level, and then the scan code of the X-axis and the Z-axis will be saved. Subsequently the generation of phantom key will be checked. If the phantom key is generated, an error message will be returned, otherwise the keyboard scan process will enter the loop for performing the scan on the Z-axis (third dimension). The inputs of the X-axis electrodes and the Y-axis electrodes which are originally pulled to a high level will be checked whether or not the inputs of these coordinate electrodes transit from high level to low level, and then the scan codes of the X-axis and the Y-axis will be saved and a synthetic determination will be made according to the scan codes previously saved to identify the key being pressed. Thereafter the generation of phantom key will be checked. If the phantom key is generated, an error message will be returned, otherwise the scan codes previously saved will be saved to the input buffer, and the scan loop will continue until the keyboard scan process is completed.

It is to be known from the look-up table of FIG. 2(c) that the keyboard encoder IC according to a first preferred embodiment of the present invention only needs 4+4+8=16 pins (4×4×8=128 keys) to accomplish the key function definition, whereas the prior art keyboard encoder IC needs 33 pins to accomplish the key function definition. In general, the keyboard encoder IC of a first preferred embodiment of the present invention totally needs 25 pins to complete the keyboard scan process, which comprises 16 pins for accomplishing the key function definition, 2 power lines, 2 oscillator pins, 3 LEDs and CLOCK & DATA LINES. Consequently, the required pin number of the keyboard encoder IC according to the first embodiment of the present invention can be greatly reduced comparing to the prior art keyboard encoder IC, and the cost is lowered substantially.

Figure 3A:
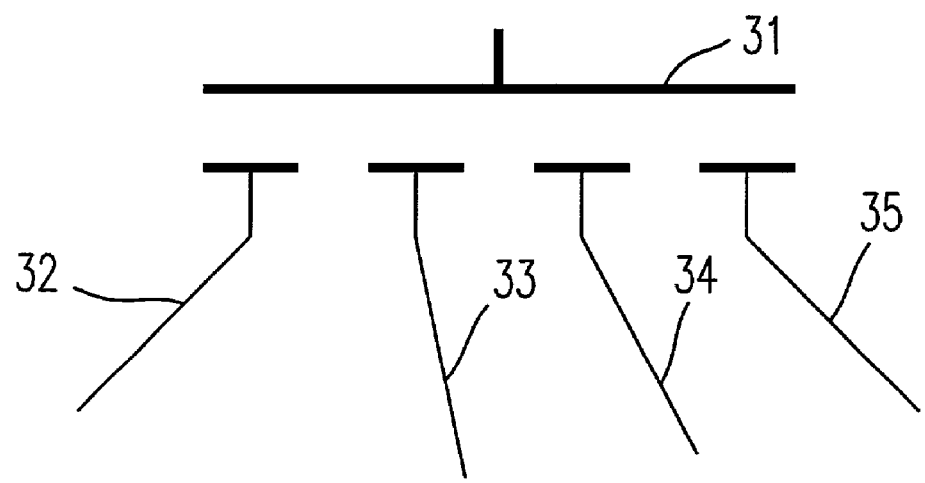
FIG. 3(a) shows the four-dimensional key structure of the keyboard according to a second preferred embodiment of the present invention.
Figure 3B:
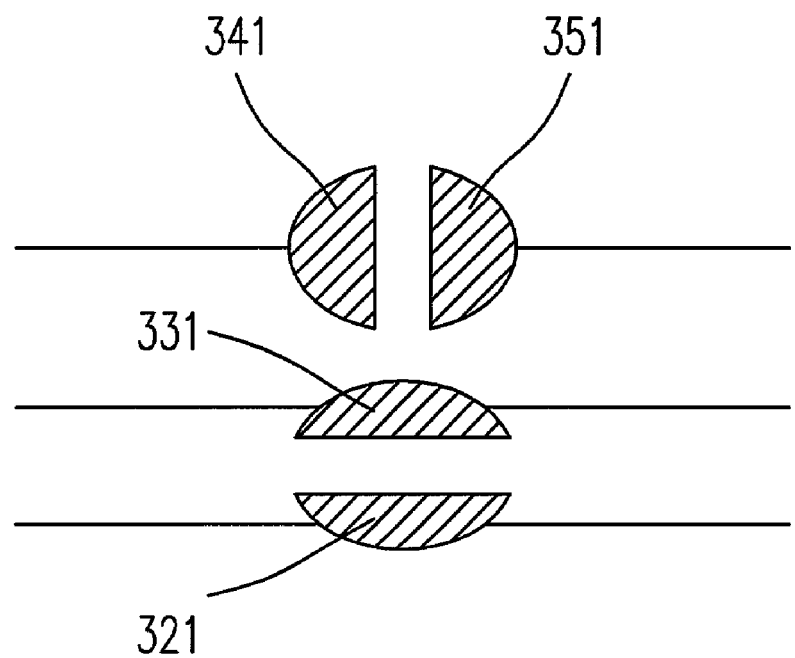
FIG. 3(b) illustrates the electrical engagement between the four-dimensional electrodes in the keyboard according to a second preferred embodiment of the present invention.
Figure 3C:
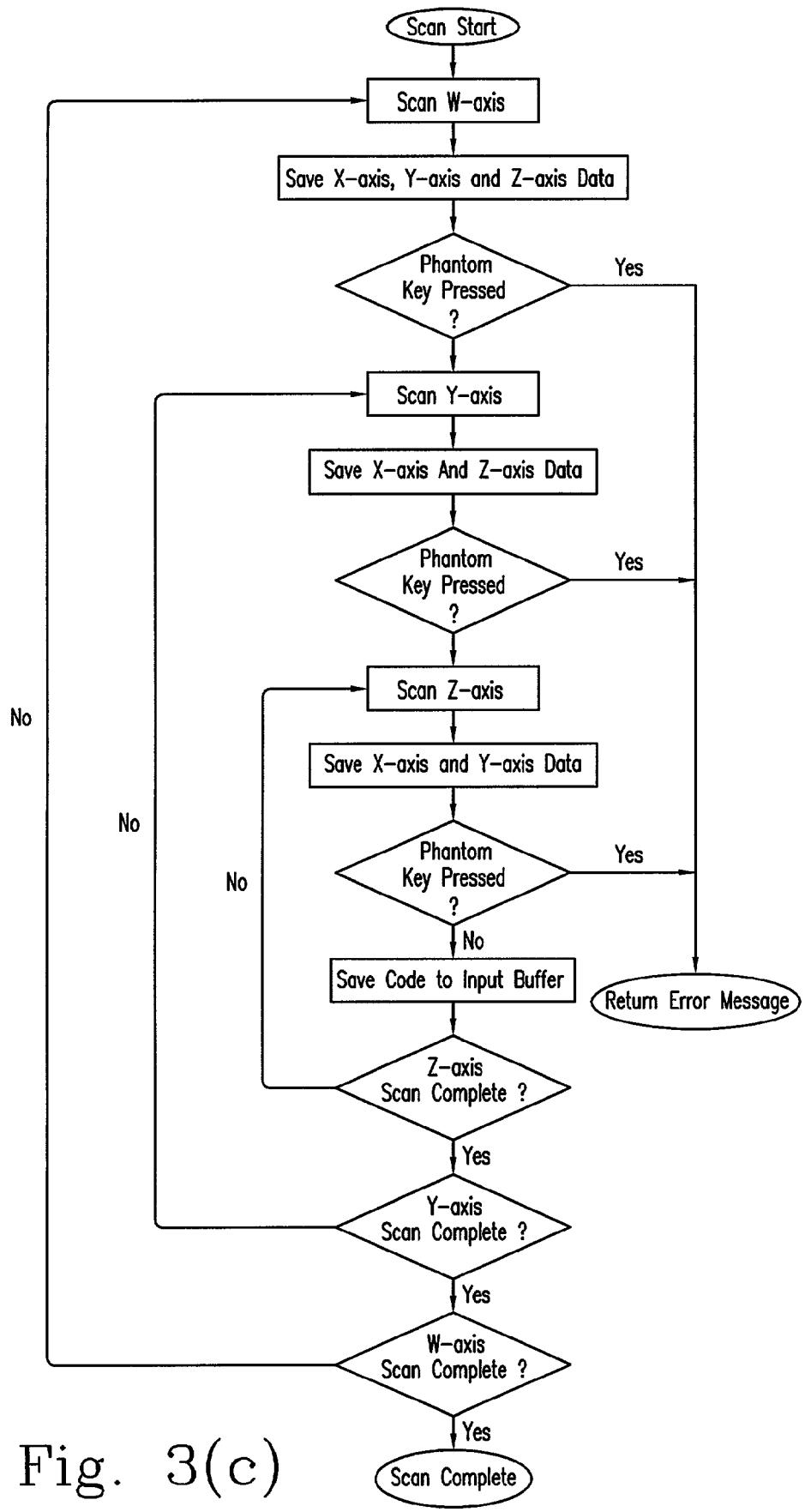
FIG. 3(c) shows the control flow of the four-dimensional keyboard scan process according to a second preferred embodiment of the present invention.

It is appreciated that the keyboard scan process of the present invention can be further applied to define the key function by four-dimensional electrodes or higher. Referring to FIG. 3(a), a second preferred embodiment of individual key structure of the present invention is shown. When key 31 is pressed, the first electrode 32, the second electrode 33, the third electrode 34 and the fourth electrode 35 are electrically engaged. The electrical engagement of these electrodes are configured as shown in FIG. 3(b). The W-axis electrode (first dimension) 321, X-axis electrode (second dimension) 331, Y-axis electrode (third dimension) 341 and the Z-axis electrode (fourth dimension) 351 are interlaced to form a four-dimensional matrix, in which each coordinate address (W-coordinate, X-coordinate, Y-coordinate, Z-coordinate) represents a key function. FIG. 3(c) illustrates the control flow of the keyboard scan process according to a second preferred embodiment of the present invention. At first, the keyboard scan process is initialized by entering the loop for performing the scan on the W-axis electrode (first dimension). When the keyboard encoder IC sequentially outputs low-level signals through the outputs of each W-axis electrodes, the inputs of the X-axis electrodes, Y-axis electrodes and the Z-axis electrodes which are originally pulled to a high level will be sequentially checked whether or not the inputs of these coordinate electrodes transit from high level to low level, and then the scan code of the X-axis, Y-axis and the Z-axis will be saved. Subsequently the generation of phantom key will be checked. If the phantom key is generated, an error message will be returned, otherwise the keyboard scan process will enter the loop for performing the scan on the Y-axis (third dimension). The inputs of the X-axis electrodes and the Z-axis electrodes which are originally pulled to a high level will be checked whether or not the inputs of these coordinate electrodes transit from high level to low level. Similarly the generation of phantom key will be checked. If the phantom key is generated, an error message will be returned, otherwise the keyboard scan process will enter the loop for performing the scan on the Z-axis (fourth dimension). In the same way, the inputs of the X-axis electrodes and the Y-axis electrodes which are originally pulled to a high level will be checked whether or not the inputs of these coordinate electrodes transit from high level to low level, and then the scan codes of the X-axis and the Z-axis will be saved. Thereafter, a synthetic determination will be made according to the scan codes save previously to identify the key being pressed. Also, the generation of the phantom key will be checked. If the phantom key is generated, an error message will be returned, otherwise the scan codes saved previously will be saved to the input buffer, and the scan loop will continue until the keyboard scan process is completed.

It is readily understood that according to a second preferred embodiment discussed above, the pin number of the keyboard encoder IC can be further reduced to 4+4+4+2=14 (4×4×4×2=128), incorporating two power lines, two oscillator pins, three LEDs and clock & data lines. In this way, the keyboard encoder IC using the keyboard scan process to define the key function according to the second embodiment of the present invention only needs 23 pins to complete the key function definition, and it is quite obvious that the cost of the keyboard can be further reduced to a certain level.

It is to be noted that the above statements is presented to interpret the distinct feature of the present invention only. However, the keyboard scan process can be equally applied to the keypad of cellular phone or other consumptive electronic device with a keyboard as the user interface.

Those of skill in the art will recognize that these and other modifications can be made within the spirit and scope of the present invention as further defined in the appended claims.

What is claimed is:

1. An input apparatus comprising:
    a plurality of keys; and
    N-dimensional electrodes, where N is a positive integer number greater than 2, and each of said keys corresponds to electrodes each of which respectively belongs to a coordinate axis of said N-dimensional electrodes, and when one of said keys is pressed, the electrodes which corresponds to said one of said keys come into an electrical engagement.

2. The input apparatus according to claim 1 wherein the electrodes corresponding to a composite key of said input apparatus are independent from the electrodes corresponding to other keys of said input apparatus.

3. The input apparatus according to claim 1 wherein said input apparatus is a computer keyboard.

4. The input apparatus according to claim 1 wherein said input apparatus is a keypad of a cellular phone.

5. An encoding method for an input apparatus having a plurality of keys, comprising the steps of:
    providing N-dimensional electrodes, where N is a positive integer number greater than two;
    resolving a plurality of coordinate addresses by said N-dimensional electrodes, each of said coordinate addresses is of N-dimension; and
    respectively defining a plurality of key functions of said keys according to said coordinate addresses.

6. The method according to claim 5 wherein the electrodes corresponding to a composite key of said input apparatus are independent from the electrodes corresponding to other keys of said input apparatus.

7. The method according to claim 5 wherein said input apparatus is a computer keyboard.

8. The method according to claim 5 wherein said input apparatus is a keypad of a cellular phone.

9. A keyboard scan process for an input apparatus which comprises a plurality of keys, each of said keys is defined by N-dimensional electrodes and where N is a positive integer number greater than two, wherein each of said keys corresponds to electrodes each of which respectively belongs to a coordinate axis of said N-dimensional electrodes, and when one of said keys is pressed, the electrodes which corresponds to said one of said keys come into an electrical engagement, said process comprises the steps of:
    (a) inputting signals to an electrode of a coordinate axis of said N-dimensional electrodes and save the outputs of other electrodes;
    (b) repeating step (a); and
    (c) identifying the key being pressed by making a synthetic determination according to the outputs previously saved.

10. The process according to claim 9 further comprising the steps of:
    checking whether or not a phantom key is generated; and
    if a phantom key is generated, return an error message.

11. A keyboard scan process for an input apparatus which comprises a plurality of keys, each of said keys is defined by first-dimensional electrodes, second-dimensional electrodes and third-dimensional electrodes, each of said keys corresponds to electrodes comprising one of said first-dimensional electrodes, one of said second-dimensional electrodes and one of said third-dimensional electrodes, and when one of said keys is pressed, the electrodes which corresponds to said one of said keys come into an electrical engagement, said process comprises the steps of:
    (a) inputting a signal to a first electrode of said second-dimensional electrodes and saving the outputs of all the electrodes of said first-dimensional electrodes and said third-dimensional electrodes;
    (b) inputting a signal to a first electrode of said third-dimensional electrodes and saving the outputs of all the electrodes of said first-dimensional electrodes and said second-dimensional electrodes;
    (c) repeating step (b) to sequentially input signals to other electrodes of said third-dimensional electrodes and saving the outputs of all the electrodes of said first-dimensional electrodes and said second-dimensional electrodes;
    (d) repeating step (a) to sequentially input signals to other electrodes of said second-dimensional electrodes and saving the outputs of all the electrodes of said first-dimensional electrodes and said third-dimensional electrodes; and
    (e) identifying the key being pressed by making a synthetic determination according to the outputs previously saved.

12. The process according to claim 11 further comprising the steps of:
    checking whether or not a phantom key is generated; and
    if a phantom key is generated, return an error message.

13. A keyboard scan process for an input apparatus which comprises a plurality of keys, each of said keys is defined by first-dimensional electrodes, second-dimensional electrodes, third-dimensional electrodes and fourth-dimensional electrodes, each of said keys corresponds to the electrodes comprising one of said first-dimensional electrodes, one of said second-dimensional electrodes, one of said third-dimensional electrodes and one of said fourth-dimensional electrodes, and when one of said keys is pressed, the electrodes which corresponds to said one of said keys come into an electrical engagement, said process comprises the steps of:

(a) inputting a signal to a first electrode of said first-dimensional electrodes and saving the outputs of all the electrodes of said second-dimensional electrodes, said third-dimensional electrodes and said fourth-dimensional electrode;

(b) inputting a signal to a first electrode of said third-dimensional electrodes and saving the outputs of all the electrodes of said second-dimensional electrodes and said fourth-dimensional electrodes;

(c) inputting a signal to a first electrode of said fourth-dimensional electrodes and saving the outputs of all the electrodes of said second-dimensional electrodes and said third-dimensional electrodes;

(d) repeating step (c) to sequentially input signals to other electrodes of said fourth-dimensional electrodes and saving the outputs of all the electrodes of said second-dimensional electrodes and said third-dimensional electrodes;

(e) repeating step (b) to sequentially input signals to other electrodes of said third-dimensional electrodes and saving the outputs of all the electrodes of said second-dimensional electrodes and said fourth-dimensional electrodes;

(f) repeating step (b) to sequentially input signals to other electrodes of said first-dimensional electrodes and saving the outputs of all the electrodes of said second-dimensional electrodes, said third-dimensional electrodes and said fourth-dimensional electrodes; and (g) identifying the key being pressed by making a synthetic determination according to the outputs previously saved.

14. The method according to claim 13 further comprising the steps of:

checking whether or not a phantom key is generated; and if a phantom key is generated, return an error message.

* * * * *